United States Patent
Cadugan et al.

(10) Patent No.: US 9,625,535 B2
(45) Date of Patent: Apr. 18, 2017

(54) SYSTEMS AND METHODS FOR COMPUTING A POSITION OF A MAGNETIC TARGET

(71) Applicant: Allegro Microsystems, LLC, Worcester, MA (US)

(72) Inventors: Bryan Cadugan, Bedford, NH (US); Jim Rice, Lafayette, CO (US)

(73) Assignee: Allegro MicroSystems, LLC, Worcester, MA (US)

( * ) Notice: Subject to any disclaimer, the term of this patent is extended or adjusted under 35 U.S.C. 154(b) by 239 days.

(21) Appl. No.: 13/960,910

(22) Filed: Aug. 7, 2013

(65) Prior Publication Data
US 2015/0042320 A1 Feb. 12, 2015

(51) Int. Cl.
G01R 33/06 (2006.01)
G01R 33/07 (2006.01)
G01D 5/14 (2006.01)

(52) U.S. Cl.
CPC .......... G01R 33/06 (2013.01); G01D 5/145 (2013.01); G01R 33/075 (2013.01)

(58) Field of Classification Search
USPC ...... 324/207.22, 207.23, 207.2, 207.21, 252, 324/251, 207.13, 207.11, 247, 207.24, 324/76.11, 207.25, 207.26; 257/E29.323, 257/421, 427; 335/284, 302
See application file for complete search history.

(56) References Cited

U.S. PATENT DOCUMENTS

| | | | |
|---|---|---|---|
| 6,131,457 A * | 10/2000 | Sato | G01P 15/0885 73/514.31 |
| 6,288,533 B1 | 9/2001 | Haeberli et al. | |
| 6,580,269 B2 * | 6/2003 | Hiligsmann et al. | 324/251 |
| 7,932,718 B1 * | 4/2011 | Wiegert | 324/247 |
| 8,575,929 B1 * | 11/2013 | Wiegert | G01R 33/0206 324/244 |
| 2006/0038557 A1 | 2/2006 | Johnson | |
| 2008/0184799 A1 * | 8/2008 | Phan Le | G01P 15/105 73/514.31 |
| 2009/0267594 A1 | 10/2009 | Kather | |
| 2011/0298447 A1 * | 12/2011 | Foletto et al. | 324/207.2 |
| 2012/0274563 A1 | 11/2012 | Olsson | |
| 2012/0280679 A1 * | 11/2012 | Shelton | 324/207.16 |

(Continued)

OTHER PUBLICATIONS

U.S. Appl. No. 14/748,823, filed Jun. 24, 2015, Sirohiwala et al.

(Continued)

*Primary Examiner* — Melissa Koval
*Assistant Examiner* — Nasima Monsur
(74) *Attorney, Agent, or Firm* — Daly, Crowley, Mofford & Durkee, LLP (57) ABSTRACT

In embodiments, three magnetic field sensing elements are arranged equidistantly from each other to define a plane and a central axis perpendicular to the plane. The magnetic field sensing elements are configured to generate a respective output signal representing proximity of a magnetic target that is proximate to the central axis and capable of moving relative to the central axis. A processor circuit is coupled to receive output signals from each of the sensors and configured to calculate a position of the magnetic target relative to the plane.

21 Claims, 9 Drawing Sheets

(56) References Cited

U.S. PATENT DOCUMENTS

2013/0147642 A1\* 6/2013 Rubio ............... G05G 9/047
 341/20
2013/0261990 A1 10/2013 Ura

OTHER PUBLICATIONS

U.S. Appl. No. 14/580,814, filed Dec. 23, 2014, Vuillermet et al.
Non-Final Office Action dated Dec. 29, 2016; for U.S. Appl. No. 14/580,814; 27 pages.

\* cited by examiner

SYSTEMS AND METHODS FOR COMPUTING A POSITION OF A MAGNETIC TARGET

This disclosure relates to magnetic field sensors and, more particularly, to magnetic field sensors for computing position of a magnetic target.

BACKGROUND

Magnetic field sensors are often used to detect position, proximity, or motion of a rotating object. For example, magnetic field sensors are used in automobile transmissions to detect speed of rotation. A magnetic target, such as a toothed gear, can be attached to a rotating element within a transmission. Magnetic field sensing elements are placed where they can detect the teeth of the gear as they rotate past the magnetic field sensing elements. As the gear moves relative to the magnetic field sensing elements, it affects a magnetic field, which is detected by the magnetic field sensing elements. Changes in the magnetic field due to the motion of gear can be detected and processed to produce position, proximity, motion, and/or speed of the gear.

Magnetic field sensors can also be used to detect position of a movable object within an area. For example, magnetic field sensing elements can be placed proximate to an area of interest to detect the position of an object within the area. As the object moves through the area, it may move closer to or further away from the sensors. If the object is close to a sensor, the sensor can detect a strong magnetic field. Conversely, if the object is relatively distant from the sensor, the sensor may pick up a relatively weaker magnetic field.

SUMMARY

In an embodiment, a system includes three magnetic field sensing elements arranged about a central axis to define a plane perpendicular to the central axis. The magnetic field sensing elements are configured to generate a respective output signal representing respective proximity of a magnetic target to the magnetic field sensing element. A processor circuit receives output signals from each of the sensors and is configured to calculate a position of the magnetic target relative to the plane. The processor may compute quadrature coordinate (e.g. X and Y coordinates) from the signals received from the magnetic field sensing elements.

In another embodiment, a method includes arranging three magnetic field sensing elements at angles around a central axis. Each magnetic field sensing element generates an output signal representing proximity of a magnetic target to the respective magnetic field sensing element. A processor calculates a position of the magnetic target. The processor provides X and Y coordinates representing the position of the magnetic target.

In another embodiment, a computer program includes instructions stored in a computer readable storage medium, which when executed by a processor causes the processor to perform operations. The operations include receiving signals from three magnetic field sensing elements, where each signal represents a respective distance between a magnetic target and a respective magnetic field sensing element. The operations also include computing a position of the magnetic target in Cartesian coordinates as a function of the three signals.

In another embodiment, an apparatus includes three inputs each capable of receiving a signal from a respective magnetic field sensing element. The signals represent proximity of a magnetic target to the respective magnetic field sensing element. The apparatus also includes a processor circuit configured to compute the position of the magnetic target based on the proximity of the magnetic target to each of the magnetic field sensing elements. The processor provides X and Y coordinates representing the position of the magnetic target.

BRIEF DESCRIPTION OF THE DRAWINGS

The figures aid in explanation of the disclosed technology and illustrate various exemplary embodiments. They are not intended to limit the scope of the invention, nor are they intended to present every possible embodiment. Like numbers in the figures denote like elements.

DETAILED DESCRIPTION

Before describing the present invention, some information is provided.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
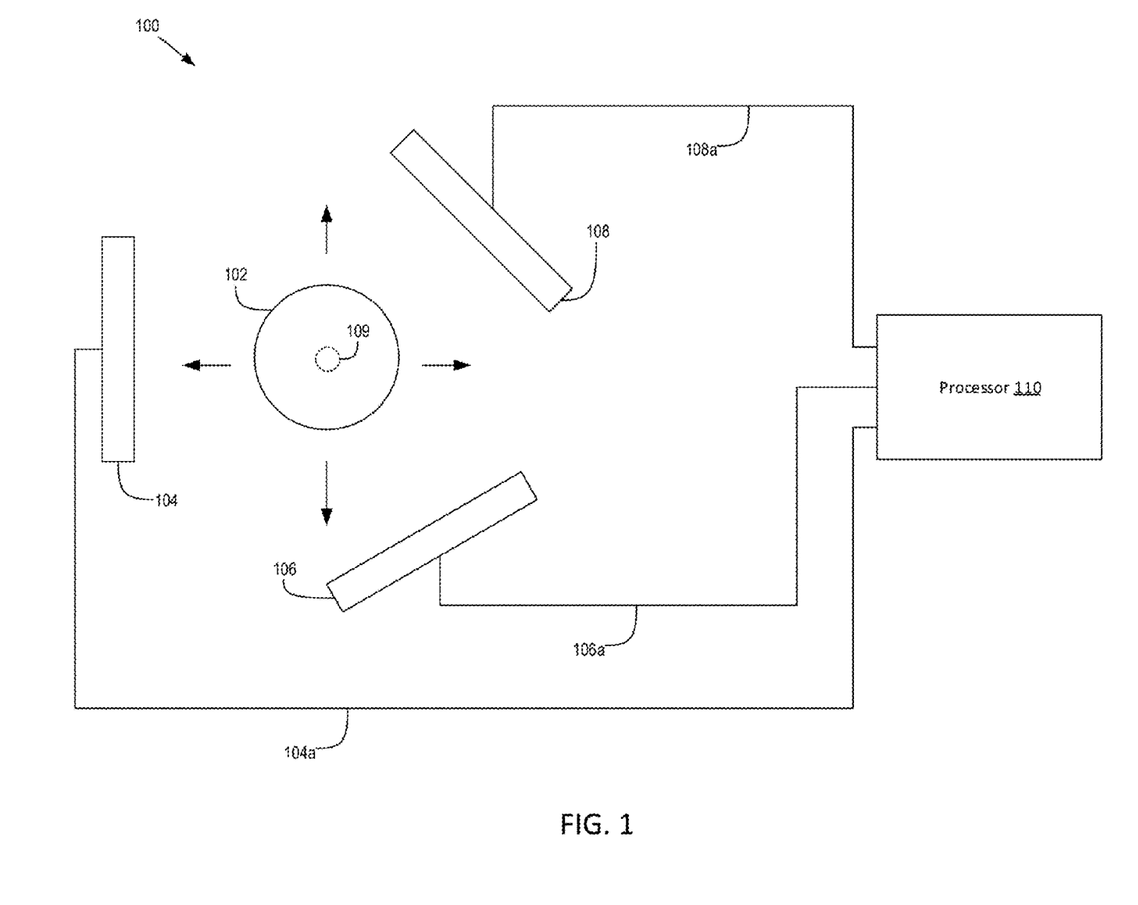
FIG. 1 is a top view block diagram of an exemplary system for detecting position of a magnetic target.

FIG. 1 is a top view of a system 100 for sensing position and motion of a magnetic target 102. Magnetic target 102 can be any object that produces a magnetic field. For example, magnetic target 102 may be a permanent magnet, such as a ferromagnetic metallic material (e.g. iron ore, cobalt, nickel, gadolinium, dysprosium, or ferromagnetic alloys), a composite material (alnico, ceramic, ferrite, a sintered composite, etc), or a rare earth magnet (samarium-cobalt, neodymium-iron-boron, etc). In certain applications, magnetic target 102 may be a single-molecule magnet or a single-chain magnet. Alternatively, magnetic target 102 may be an electromagnetic or other type of temporary magnet. If magnetic target 102 is a temporary magnet, system 100 may include a power supply and/or other circuitry capable of providing power to magnetic target 102 so that magnetic target 102 produces a magnetic field.

Magnetic target 102 may be movably mounted between magnetic field sensing elements 104, 106, and 108, and is free to move within the space between magnetic field sensing elements 104, 106, and 108, as indicated by arrows 110. Three magnetic field sensing elements 104, 106, and 108 are disposed about magnetic target 102. In an embodiment, magnetic target 102 can also move outside of the space between sensing elements 104, 106, and 108. For example, magnetic target 102 may be mounted above or below the plane defined by sensing elements 104, 106, and 108 so that it can move past sensing elements 104, 106, and/or 108 into the area outside the sensing elements.

Sensing elements 104, 106, and 108 may comprise Hall Effect elements, magnetoresistive elements, giant magnetoresistive (GMR) elements, or any type of magnetic field sensing element described above that can detect a magnetic field. In response to the magnetic field, magnetic field sensing elements 104, 106, and 108 (or simply "sensing elements") produce signals 104a, 106a, and 108a, respectively, in response to the magnetic field. Signals 104a, 106a, and 108a may be voltage signals, current signals, etc. If sensing elements 104, 106, and 108 are Hail Effect elements, sensing elements 104, 106, and 108 may produce a voltage signal in response to the proximity of magnetic target 102. The voltage signal may pass through an amplifier (not shown), a filter (not shown), and/or an analog-to-digital converter (not shown) prior to being received by processor 110. If sensing elements 104, 106, and 108 are GMR elements, for example, the electrical resistance of the GMR elements may change in response to the proximity of magnetic target 102. In this case, a power supply circuit may provide power to sensing elements 104, 106, 108, which may act as resistor dividers. The resulting voltage across sensing elements 104, 106, and/or 108 can be provided to processor 110 as signals 104a, 106a, and 108a. Of course, these signals may also pass through amplifiers, filters, and/or analog to digital converters prior to being received by processor 110.

In an embodiment, sensing elements 104, 106, and 108 may be arranged so that their respective axes of maximum sensitivity are directed toward a central location. The central location may be a center point of an area within which magnetic target 102 can move. For example, as shown in FIG. 1, axes of maximum sensitivity of sensing elements 104, 106, and 108 may point toward a central point or axis 109 (represented by a dotted line in FIG. 1 between sensing elements 104, 106, and 108.

In various embodiments, sensing elements 104, 106, and 108 are arranged equidistantly around central point 109. For example, in FIG. 1, magnetic element 102 is shown in a central position. Sensing elements 104, 106, and 108 are arranged around sensing element 102 at increments of approximately 120 degrees from each other. Additionally, sensing elements 104, 106, and 108 are arranged so that they are each the same distance from magnetic element 102 when magnetic element 102 is in a central position.

Figure 1A:
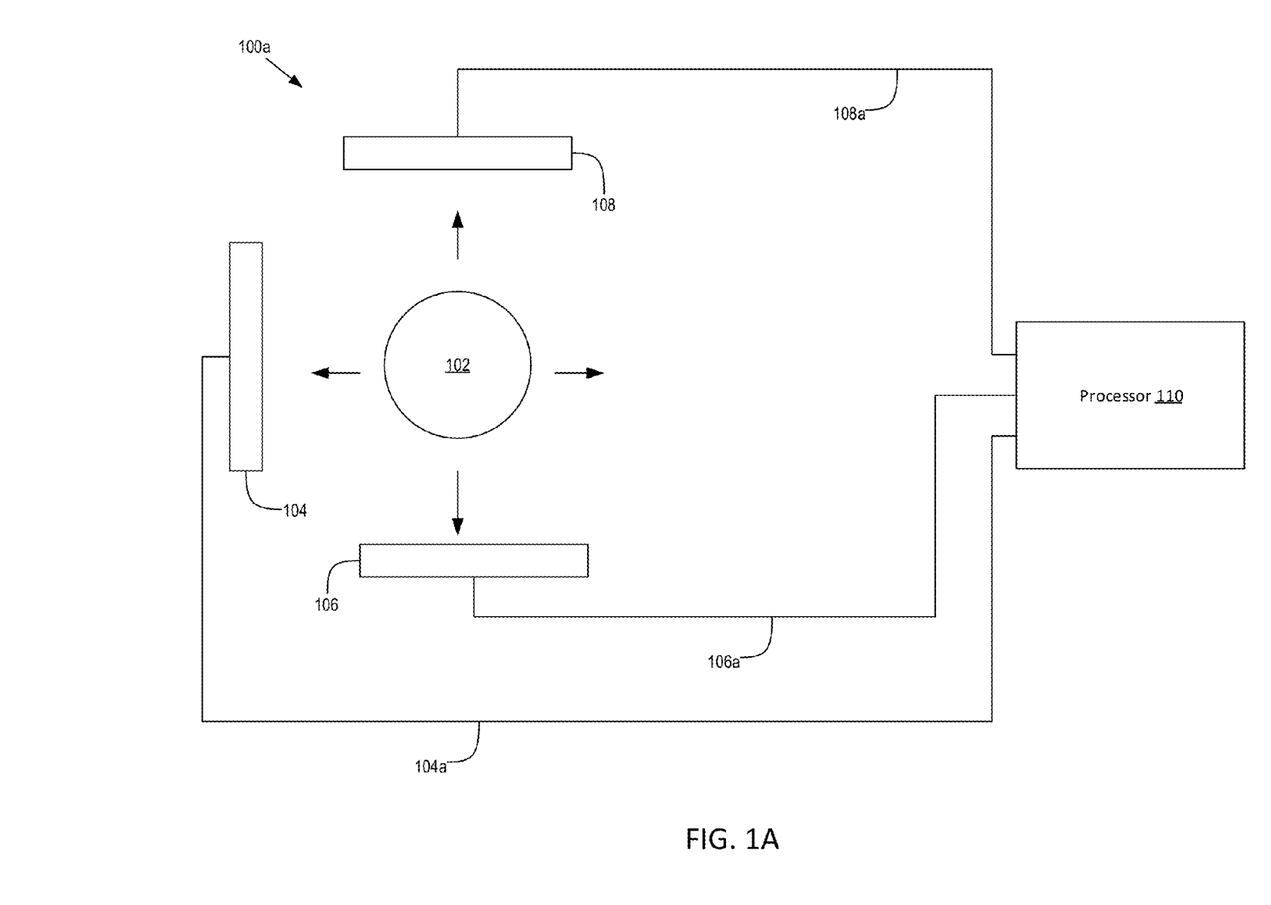
FIG. 1A is a top view block diagram of another exemplary system for detecting position of a magnetic target.

In other embodiments, sensing elements 104, 106, and 108 may be placed in different arrangements. As shown in FIG. 1A, a system 100a includes sensing elements 104, 106, and 108 which may be arranged in 90 degree increments. In this arrangement, sensing element 104 may detect magnetic target 102's position in an axis (e.g. an X axis), and sensing elements 106 and 108 may detect target 102's position along a perpendicular axis (e.g. a Y axis). Because there are two sensing elements along the Y axis, system 100 as shown in FIG. 1A may be able to detect position in the Y axis with more accuracy than position in the X axis. Such an arrangement may be used in applications where position detection along one axis requires greater precision than position detection along other axes.

Figure 1B:
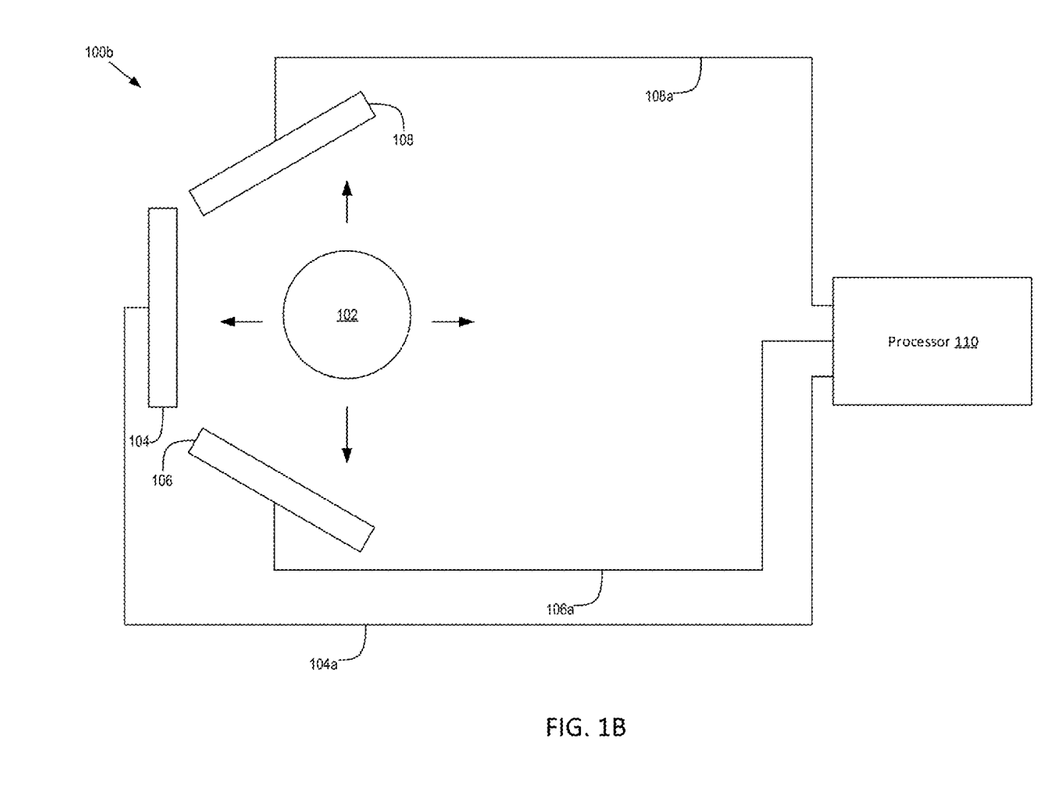
FIG. 1B is a top view block diagram of another exemplary system for detecting position of a magnetic target.

FIG. 1B shows yet another embodiment of a system 100b, in which sensing elements 104, 106, and 108 are arranged in 60 degree increments about the central location. Although not shown, other arrangements of sensing elements 104, 106, and 108 are possible. In each arrangement, axes of maximum sensitivity of sensing elements 104, 106, and 108 can face the central point from a different angle.

Processor 110 includes software and/or circuitry capable of receiving the signals 104a, 106a, and 108a, and computing the position of magnetic target 102 based on those signals. The particular arrangement of sensing elements 104, 106, and 108 may be known by processor 110 so that processor 110 can compute the position of magnetic target 102 based on the values of signals 104a, 106a, and 108a. In other embodiments, processor 110 may contain algorithms to determine, during operation, whether the arrangement of sensing elements 104, 106, and 108 is one of a set of known arrangements.

Figure 2:
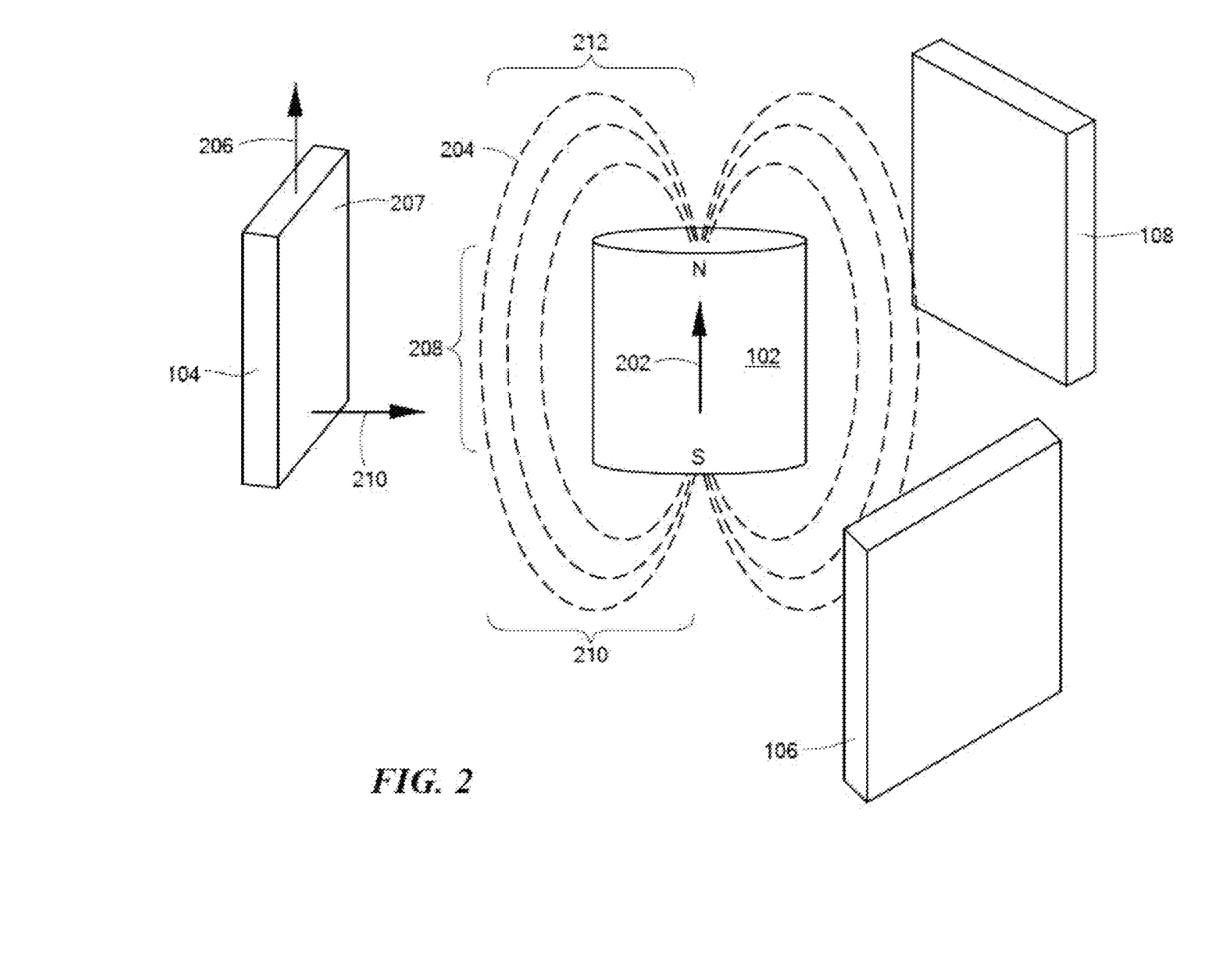
FIG. 2 is an isometric view of an exemplary system for detecting position of a magnetic target showing magnetic field sensing elements and magnetic target.

FIG. 2 is an isometric view of sensing elements 104, 106, and 108, and magnetic target 102. In FIG. 2, magnetic sensors 104, 106, and 108 are arranged at 120 degree intervals around magnetic target 120. As known in the art, three points can define a plane in space. Therefore, geometric centers of sensing elements 104, 106, and 108 can be viewed as three points that define a plane. See, for example, plane 304 in FIG. 3.

In some embodiments, sensing elements 104, 106, and 108 may have axes of maximum sensitivity parallel to the face sensing element, as shown by arrow 206. In this case, the sensing elements may detect magnetic field lines that are also substantially parallel to the face 207 of the sensing element (e.g. magnetic field lines such as those in or near region 208). In other embodiments, sensing elements 104, 106, and 108 may have axes of maximum sensitivity perpendicular to the face 207 of the sensing elements, as shown by arrow 210. In this case, the sensing elements may detect magnetic field lines that area also substantially perpendicular to face 207 (e.g. magnetic field lines such as those in region 210 or 212). In such embodiments, magnetic target 102 may be positioned above or below the sensing elements 104, 106, and/or 108 so that magnetic field lines in region 210 or 212 are positioned between the sensing elements and can be detected with greater sensitivity.

In some embodiments, the magnetic field provided by magnetic target 102 has a direction (e.g. as indicated by anew 202) Because the magnet is above the plane defined by sensing elements 104, 106, and 108, the magnetic field or flux at the plane defined by geometric centers of sensing elements 104, 106, and 108 is parallel to the plane, and therefore, parallel to the maximum response axes of the sensing elements 102, 104, 106, it should also be apparent that a magnitude of the field parallel to the plane diminishes with distance from magnetic target 102. In other words, at any point in the plane, the strength of magnetic field 204 in a direction parallel to the plane is proportional to the distance from magnetic target 102. Thus, if magnetic target 102 is relatively close to and any particular sensing element, that sensing element will sense a relatively strong magnetic field. The sensing element will then produce a signal with a large magnitude indicating presence of a strong field. Conversely, if magnetic target 102 is relatively distant from any particular sensing element, that sensing element will sense a relatively weak magnetic field. That sensing element will produce a signal with a small magnitude indicating presence of a weak field. Processor 110 can receive these signals and determine the position of magnetic target 102 within the plane based on the strength of the magnetic field sensed by each sensing element 104, 106, and 108.

Figure 3:
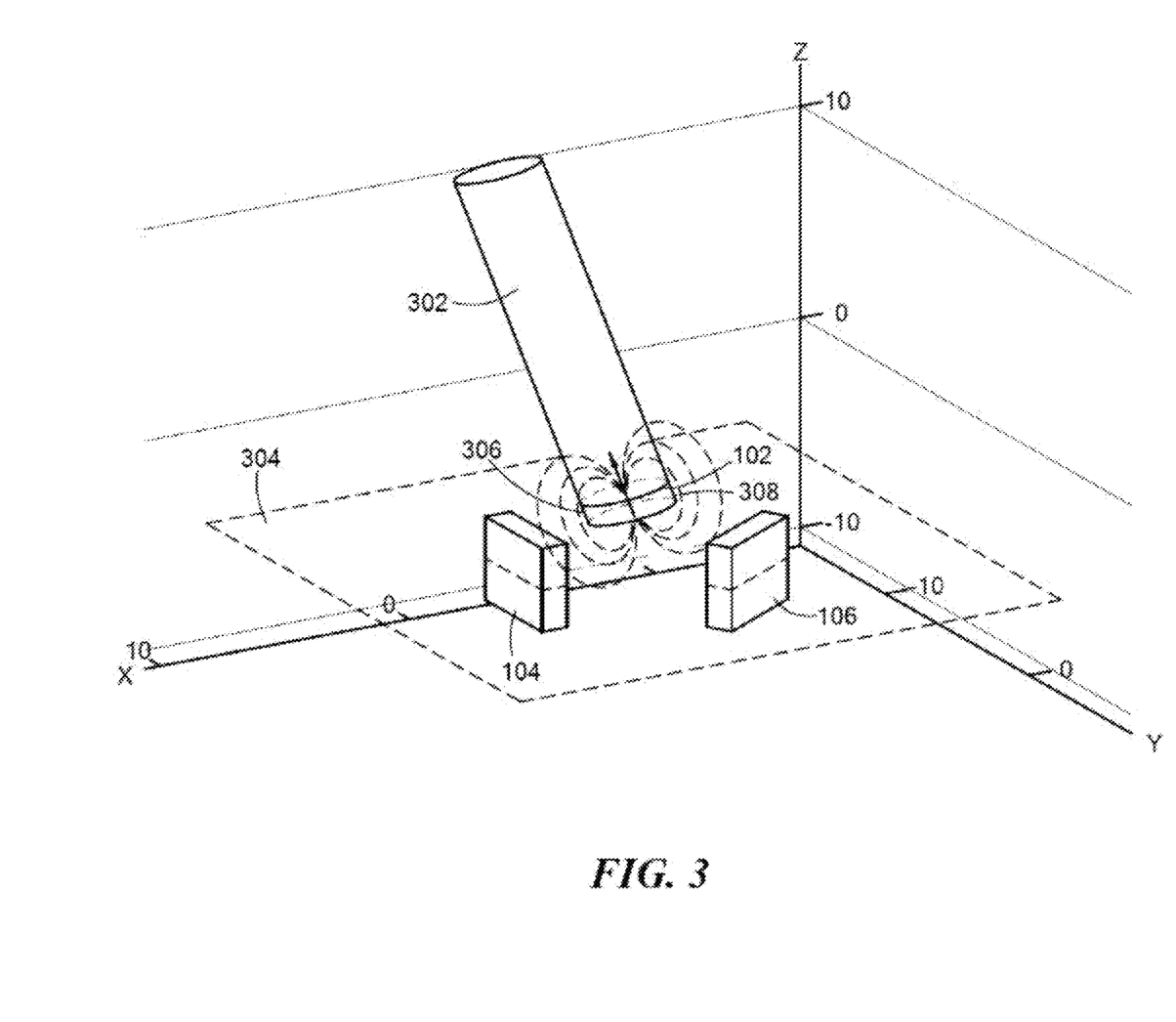
FIG. 3 is an isometric view of an exemplary system for detecting position of a magnetic target including a pivotal member.
Figure 4:
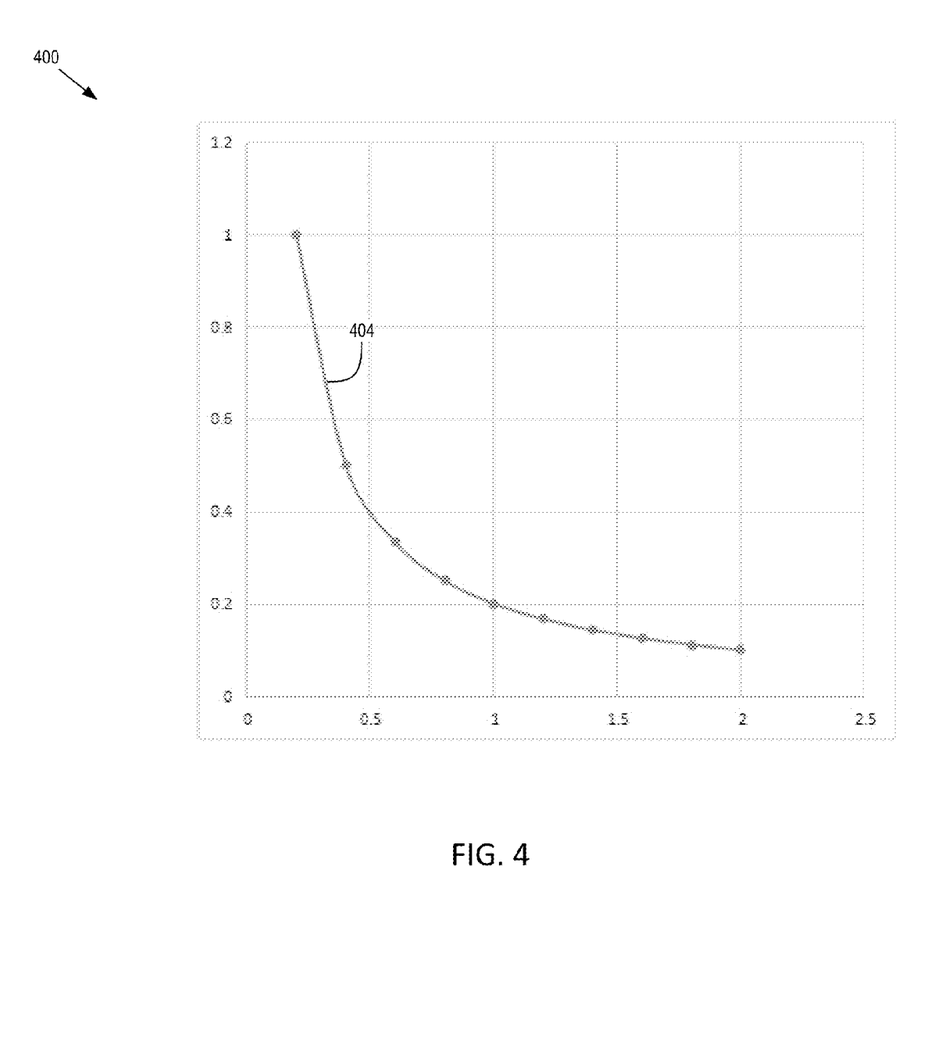
FIG. 4 is a graph of an output signal of a magnetic field sensing element used in one of the exemplary systems above.

FIG. 3 is an isometric view of system 100. In FIG. 3, sensing elements 104, 106, and 108 are arranged in 120 degree increments about magnetic target 102. Magnetic target 102 is coupled to a pivotal member 302 and above a plane defined by geometric centers of the sensing elements 102, 1904, 106. Pivotal member 302 may be a rod or shaft having a pivot point that allows pivotal member to tilt with respect to the plane 304 defined by sensing elements 104, 106, and 108. The pivot point can be above, below, or within plane 304 if desired. In some embodiments, the pivot point is centrally located between sensing elements 104, 106, and 108. However, this is not a requirement—the pivot point can be offset from center if desired. Pivotal member 302 may be designed to tilt in any direction (similar to a gaming joystick), or in four directions (similar to a gaming D-Pad), or in any number of directions. In some embodiments, pivotal member 302 is a computer or gaming joystick and system 100 may be mounted or installed within a housing of the joystick. The joystick lever may have a proximate end, i.e. an end closest to the user that the user can move. As the user moves the proximate end of the joystick lever, magnetic target 102 may move in a proportionate distance and/or direction.

As shown in FIG. 3, magnetic target 102 may be coupled or integral to pivotal member 302, and may be positioned above the plane 304. In this configuration, when pivotal member 302 tilts, magnetic target 102 will move relative to sensing elements 104, 106, and 108. As shown, pivotal member 302 is tilted toward sensing element 104 so that magnetic target 102 is closer to sensing element 104 than to sensing elements 106 and 108. In some embodiments, magnetic target 102 is positioned below plane 304.

Pivotal member 302 and magnetic target 102 can be arranged in various configurations so long as movement of pivotal member 302 results in movement of magnetic target 102 relative to sensing elements 104, 106, and 108. In some embodiments, pivotal member 302 can have a pivot point above, below, or within plane 304. Magnetic target 102 may be positioned so that the pivot point is between plane 304 and magnetic target 102, so that magnetic target 102 is between plane 304 and the pivot point, or so that plane 304 is between magnetic target 102 and the pivot point. An any of these arrangements, as pivotal member 302 move, magnetic target 102 may also move relative to (i.e. toward or away from) one or more of the sensing elements.

In certain embodiments, the pivot point and target 102 are co-located. For example, as shown in FIG. 3, magnetic target 102 and the pivot point of pivotal member 302 are in approximately the same location, so that magnetic target 102 is pivotally mounted in a fixed position. In such embodiments, instead of magnetic target 102 moving toward or away from the sensing elements, magnetic target 102 tilts toward or away from sensing elements 104, 106, 108. The tilting motion can change the strength of the magnetic field sensed by sensing elements 104, 106, and/or 108. The change in strength may be used to determine a tilt of magnetic target 102, rather than a position of magnetic target 102 within plane 304. For example, as shown in FIG. 3, magnetic target 102 is above plane 304 and pivotal member 302 is tilted toward sensing element 104. Thus, the edge 306 of magnetic target 102 is tilted down toward sensing element 104 and the edge 308 of magnetic target 102 is tilted up and away from sensing elements 106 and 108. As edge 306 tilts toward sensing element 104, sensing element 104 senses a stronger magnetic field. Conversely, as edge 308 tilts away from sensing elements 106 and 108, sensing elements 106 and 108 senses a weaker magnetic field.

Figure 5:
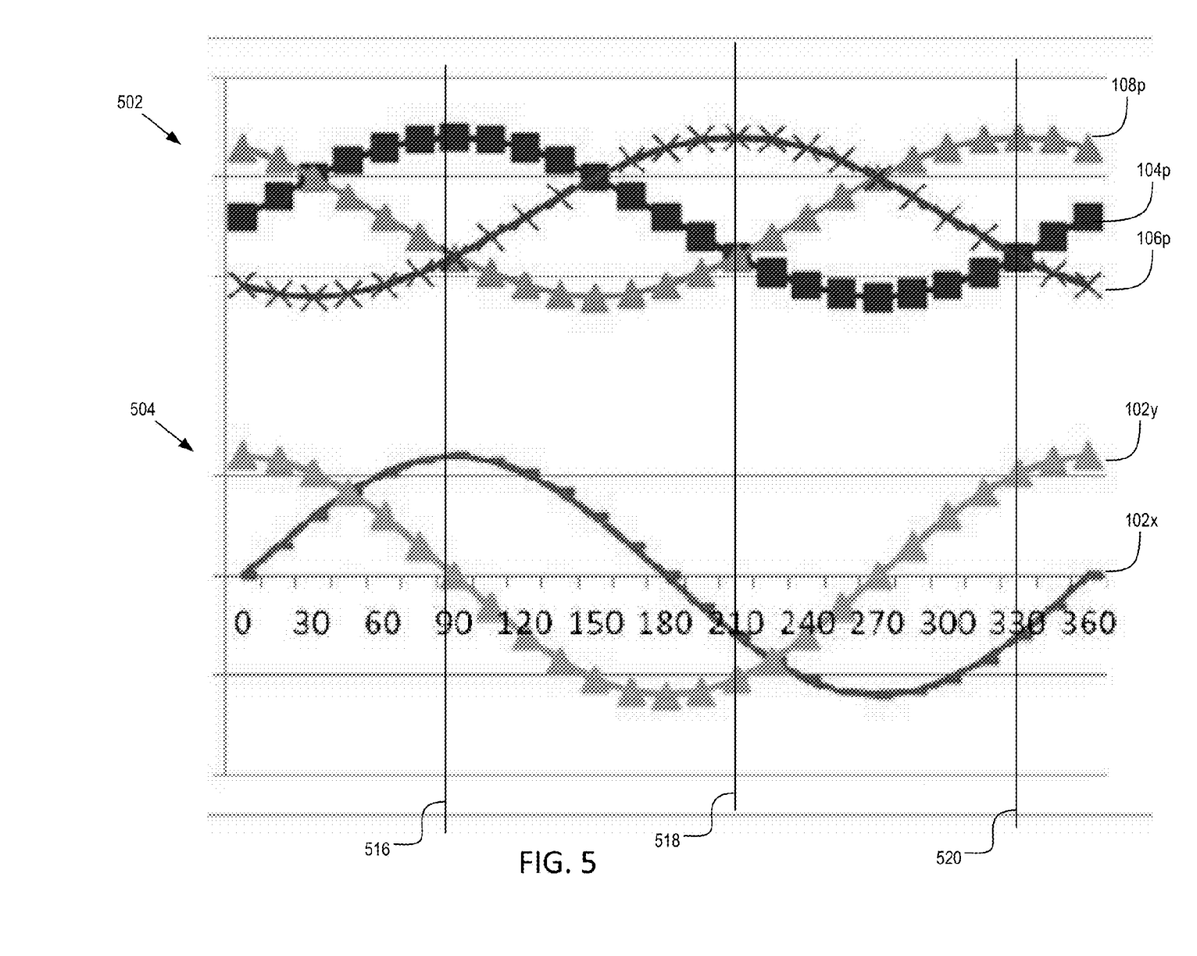
FIG. 5 is a series of graphs illustrating computation of the position of a magnetic target as performed in one of the exemplary systems above.

Referring now to FIG. 5, graph 400 illustrates the output of a sensing element (e.g. sensing element 104, 106, or 108) based on proximity of magnetic target 102. The graph 400 has a vertical axis with a scale in units of voltage or current in arbitrary units. The graph 400 also has a horizontal axis with a scale in units of distance in arbitrary units. A curve 404 represents behavior of an output signal generated by one of the sensing elements 1104, 106, 108 as a distance from magnetic target 102 changes, i.e. as target 102 moves toward or away from the sensing element. As shown, the output signal from the sensing element is inversely proportional to the distance. In other words, as the distance between magnetic target 102 and the sensing element increases, the output signal decreases. However, this graph 400 is provided as an example only, in other configurations, the output signal from the sensing element may increase as the distance between the sensing element and target 102 increases. For example, the signals 104a, 106a, and 108a may be inverted (e.g. by electronic circuitry) prior to being received by processor 110 so that the signals 104a, 106a, and 108a increase as the distance between sensing element and target 102 increases.

Irrespective of the shape of curve 404, curve 404 may be deterministic with respect to the distance between the sensing element and magnetic target 102. Regardless of the shape of the curve, as long as curve 404 is deterministic and/or predictable, processor 110 can compute distance between magnetic target 102 and the sensing element. By computing the distance between magnetic target 102 and each of the sensing elements 104, 106, and 108, processor 110 can compute the position of magnetic target 102. Processor 110 can then use the distance from each sensing element to computer an x coordinate and a y coordinate that represent target 102's position within plane 304 (see FIG. 3).

Figure 6:
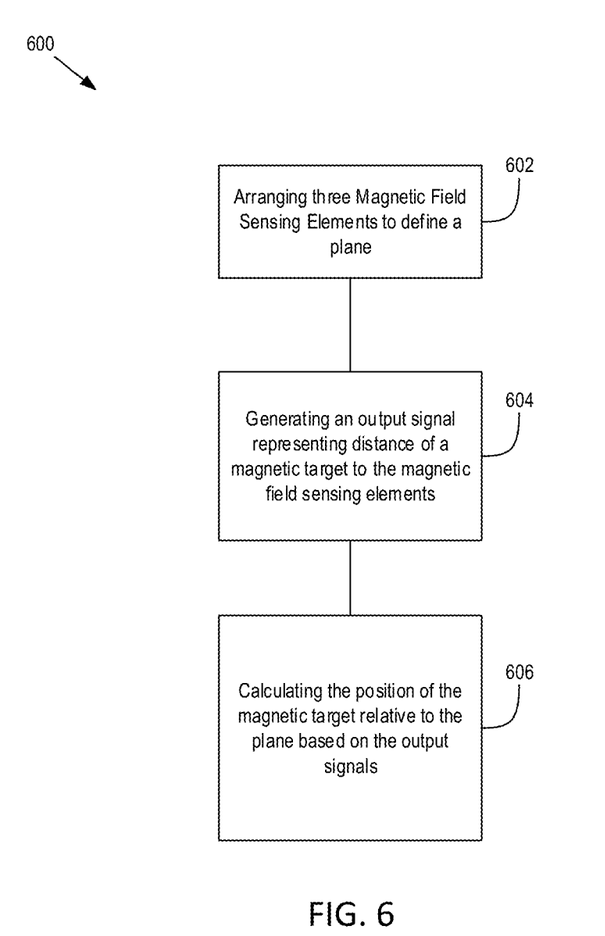
FIG. 6 is a flowchart of a process for computing position of a magnetic target.

Referring now to FIG. 6, graphs 502 and 504 have vertical axes in units of voltage or current in arbitrary units and a horizontal axis with a scale in units of angle from zero to three hundred sixty degrees. The graphs 502 and 504 in FIG. 6 show an example of how processor 110 can convert distance from each of the sensing elements to X and Y coordinates. Curve 104p represents proximity to sensing element 104, curve 106p represents proximity to sensing element 106, and curve 108p represents proximity to sensing element 108. In this example, magnetic target 102 moves in a counterclockwise circle within plane 304 and sensing elements 104, 106, and 108 are arranged at increments of 120 degrees, as shown in FIG. 1. Thus, the curves 104p, 106p, 108p represent a circular motion of the target 102. The horizontal axis could also have a scale in units of time in arbitrary units, assuming that the speed of the circular motion is constant. In graph 504, curves 102x and 102y provide a quadrature representation of target 102's position: curve 102x represents target 102's position along a Cartesian. X axis and curve 102y represents target 102's position along a Cartesian Y axis.

The circular motion can be seen by examining the local maximums and minimums of the curves in graph 502 and 504. At angle 516, target 102 is closest to sensing element 104 as shown by the peak in curve 104p. At this time, target 102 is also roughly equidistant from sensing elements 106 and 108, as shown by the crossing point of curves 106p and 108p. At angle 518, target 102 is closest to sensing element 106 and roughly equidistant from sensing elements 104 and 108. At angle 520, magnetic target 102 is closest to sensing element 108 and roughly equidistant from sensing elements 104 and 106.

Based on these proximities (i.e., based upon positions on the curves 104p, 106p, 108p), processor 110 can compute the X and Y coordinates (i.e. positions on the curves 102x and 102y) of magnetic target 102 based on the signals from the magnetic sensors, Since, in embodiments, the three sensors are not positioned on the X and Y axis, the signals received by processor 110 may be viewed as a three-phase signal representing position. Processor 110 may receive these signals and convert them into Cartesian X and Y signals representing a position of magnetic target 102 along an X and Y axis.

In some embodiments, to improve accuracy of the sensed position, processor 110 can compute an X and Y coordinates using each signal from each sensing element, and average the results together. For example, if magnetic field sensing element 104 is placed so that it senses distance along an X axis, and magnetic field sensing elements 106 and 108 are placed at 120 degree increments (as shown in FIG. 3), processor 110 can use the output signal of each sensing element to compute the X coordinate of the magnetic target 102. Processor 110 can then average the computed values together to increase accuracy of the computation. For example, if sensing elements 104, 106, and 106 are placed at 120 degree increments, processor 110 may use the following formulas to compute the X position of magnetic target 102:

$$X = F - \left(\frac{G+H}{2}\right)$$

In the previous formula, X is the computed X positions of magnetic target 102, F is the distance between sensing element 104 and magnetic target 102, G is the distance between sensing element 106 and magnetic target 102, and H is the distance between sensing element 108 and magnetic target 102.

In another embodiment, the following formula may be used to compute the X position of magnetic target 102:

$$X = \frac{(X_{104} + D_{104}) + (X_{106} - D_{106}\text{COS}(60)) + (X_{108} - D_{108}\text{COS}(60))}{3}$$

In the previous formula, $X_{104}$ is the X coordinate of sensing element 104 and $D_{104}$ is the distance between sensing element 104 and magnetic target 102; $X_{106}$ is the X coordinate of sensing element 106 within the Cartesian plane and $D_{106}$ is the distance between sensing element 106 and magnetic target 102; and $X_{108}$ is the X coordinate of sensing element 108 and $D_{108}$ is the distance between sensing element 108 and magnetic target 102.

Using the same example, the following formula may be used to compute the Y position of magnetic target 102:

$$Y = \sin(90)/\sin(120) * \left(\frac{3*G}{2} - \frac{3*H}{2}\right)$$

In the previous formula, Y is the computed Y coordinate of magnetic target 102, G is the distance between sensing element 106 and magnetic target 102, and H is the distance between sensing element 108 and magnetic target 102.

In another embodiment, the following formula may be used to compute the X position of magnetic target 102:

$$Y = \frac{(Y_{106} + D_{106}\text{COS}(30)) + (Y_{108} - D_{108}\text{COS}(30))}{2}$$

In the previous formula, $Y_{106}$ is the Y coordinate of sensing element 106 within the Cartesian plane and $D_{106}$ is the distance between sensing element 106 and magnetic target 102; and $Y_{108}$ is the Y coordinate of sensing element 108 and $D_{108}$ is the distance between sensing element 108 and magnetic target 102. In this formula, the distance between sensing element 104 and magnetic target 102 is not used because sensing element 104 is positioned to sense distance directly along the X axis. Therefore, the distance measured by sensing element 104 does not include a Y coordinate.

These formulas are provided as examples only. The formulas above may be used, for example, if the sensing elements are arranged in 120 degree increments (as shown in FIG. 1). Other formulas may be used if the sensing elements are placed in other positions. For example, the sensing elements may be placed in 45 degree increments, 60 degree increments, 90 degree increments, 120 degree increments, 135 degree increments, etc. Also, the sensing elements need not be placed in regular increments. For example, there may be any angle A between sensing element 104 and sensing element 106, and any angle B between sensing element 104 and sensing element 108. The angles A and B need not be the same angle.

Depending on the arrangement of the sensing elements, the angles between them, and the desired results, different formulas may be used to compute the X and Y quadrature coordinates of magnetic target 102. It will also be apparent that, if target 102 is pivotally mounted in a fixed position, other formulas may be used to determine the tilt of target 102. In embodiments, the formulas used to compute the X and Y coordinates may be adjusted to alter sensitivity, accuracy, timing, or other parameters relating to the position of magnetic target 102.

In some embodiments, sensing the position of magnetic target 102 is a means of sensing the position of the target 102, and therefore, tilt and direction of tilt of pivotal member 302. For example, if pivotal member 302 is a joystick lever, the X, Y position of magnetic target 102 can indicate the tilt and direction of tilt of the joystick lever. Thus, processor 110 can compute, based on the position of magnetic target 102, how far the joystick lever has been tilted and in which direction. In such an embodiment, processor 110 can compute X, Y coordinates indicative of angle and direction of tilt of the joystick lever based on the sensed position of magnetic target 102.

Figure 7:
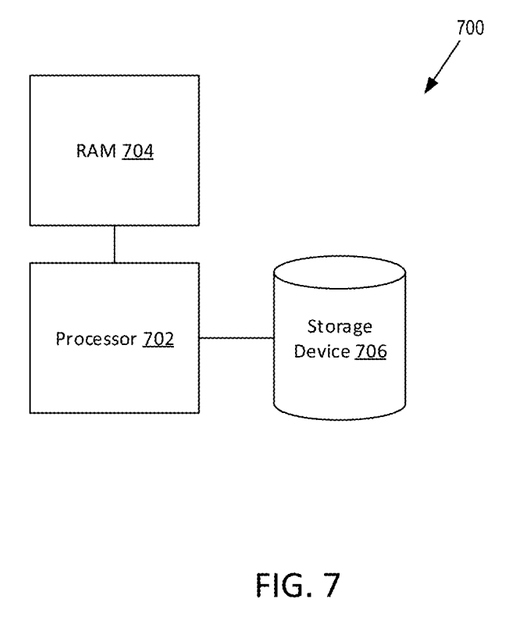
FIG. 7 is a block diagram of a computing device.

Referring now to FIG. 7, a process 600 for sensing position of a magnetic target is shown. In block 602, three magnetic field sensing elements (e.g., 104, 106, and 108) are arranged to define a plane. In an embodiment, these magnetic field sensing elements may be arranged in 120 degree increments from each other. In block 604, the magnetic field sensing elements generate output signals representing the distance between the magnetic target and each respective sensing element. In block 606, the X and Y coordinates of the position of the magnetic target relative to the plane is computed based on the distance from the target to each of the sensing elements. Equations above may be used for this computation.

As noted above, processor 110 may contain circuits and/or software to calculate the position of the magnetic target. As used herein, software refers to computer readable instructions that cause a processor (or other type of circuit) to perform particular operations. Software can comprise microcode, assembly code, machine code, scripts, compiled code, or any other type of instructions. The software may be stored in a computer readable storage device, such as a volatile memory (e.g. RAM) or a non-volatile memory (e.g. ROM, Flash, a hard drive, CD, DVD, and the like).

FIG. 8 shows an exemplary computing system 700 that can execute software. System 700 includes a processor 702 (which may be the same as or similar to processor 110), a random access memory (RAM) 704, and a storage device 706, which may be a hard drive, a CD, a DVD, a flash drive, or any other type of non-volatile memory. Software instructions may be stored in RAM 704 and/or storage device 706. Processor 702 may be coupled to storage device 706 and/or RAM 704 so that processor 702 can read the software instructions. As processor 702 reads the software instructions, the software instructions may cause processor 702 to perform operations, as described above, for computing the position of a magnetic target. Although not shown, processor 702 and/or system 700 may include other inputs and outputs, such as inputs for receiving the signals from the sensing elements, GPIO, power inputs, or other interfaces such as USB, SATA, HDMI, and the like.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

What is claimed is:

1. A system comprising:
    exactly three magnetic field sensing elements arranged in a non-collinear arrangement to define a plane having two dimensions, the magnetic field sensing elements each configured to generate a respective output signal representing a respective distance of a magnetic target from the respective magnetic field sensing element, wherein the magnetic target has a freedom of translational movement in at least the two dimensions of the plane;
    a pivotal member coupled to the magnetic target, wherein the magnetic target is fixedly attached to the pivotal member and does not move relative to the pivotal member, the pivotal member positioned so that movement of a proximate end of the pivotal member causes proportional translational movement of the magnetic target in the two dimensions of the plane; and
    a processor circuit coupled to receive output signals from each of the sensors and configured to calculate a translational location of the magnetic target within the two dimensions of the plane.

2. The system of claim 1 wherein the pivotal member has a pivot point on a central axis around which the magnetic field sensing elements are arranged.

3. The system of claim 2 wherein the pivotal member comprises an elongate member that, in the absence of an external force, returns to a position parallel to the central axis.

4. The apparatus of claim 1 wherein the pivotal member comprises a joystick lever.

5. The system of claim 1 wherein the processor circuit provides the location of the magnetic target by providing an X coordinate and a Y coordinate representing a translational location within the plane.

6. The apparatus of claim 1 wherein the processor provides the translational location of the magnetic target by providing a tilt value of the member and a direction of tilt of the pivotal member.

7. The system of claim 1 wherein the magnetic target comprises a permanent magnet.

8. The system of claim 1 wherein the magnetic field sensing elements comprise Hall Effect elements, giant magnetoresistance elements, or both.

9. The apparatus of claim 1 wherein the magnetic field sensing elements are arranged at regular increments about a central axis.

10. A method comprising:
    arranging exactly three magnetic field sensing elements in a non-collinear arrangement to define a plane having two dimensions;
    generating, by each magnetic field sensing element, an output signal representing a distance of a magnetic target to the respective magnetic field sensing element, wherein the magnetic target has a freedom of translational movement at least in the two dimensions of the plane;

pivoting a pivotal member which, when moved, causes the translational movement of the magnetic target in at least the two dimensions, wherein the magnetic target is fixedly attached to the pivotal member and does not move relative to the pivotal member; and calculating, by a processor coupled to receive the output signals from each of the magnetic field sensing elements, a translational location of the magnetic target in the two dimensions of the plane based on the signals from the three magnetic field sensing elements.

11. The method of claim 10 wherein the pivotal member comprises a joystick lever and moving the magnetic target comprises moving the joystick lever.

12. The method of claim 10 wherein calculating the translational location includes providing an X coordinate and a Y coordinate representing the translational location within the plane.

13. The method of claim 10 wherein calculating the location includes providing a tilt value of the pivotal member and a direction of tilt of the pivotal member.

14. The method of claim 10 further comprising arranging the magnetic field sensing elements at regular increments about a central axis.

15. A computer program, stored in a non-transitory computer readable storage medium, which when executed by a processor causes the processor to perform operations comprising:

receiving signals from exactly three magnetic field sensing elements that are arranged in a non-collinear arrangement to define a plane having two dimensions, each signal representing a respective distance between a magnetic target and a respective magnetic field sensing element, wherein the magnetic target has a freedom of translational movement in at least the two dimensions of the plane;

computing a translational location of the magnetic target as a function of the three signals; and providing output signals representing the translational location of the magnetic target in Cartesian coordinates;

wherein the magnetic target is fixedly attached and does not move relative to a pivotal member, and translational movement of the magnetic target in the two dimensions is caused by movement of the pivotal member.

16. An apparatus comprising:

three inputs each capable of receiving a signal from a respective one of exactly three magnetic field sensing elements, the signal representing proximity of a magnetic target to the respective magnetic field sensing element, wherein the magnetic target has a translational freedom of movement in at least two dimensions of a plane defined by the exactly three magnetic field sensing elements a pivotal member coupled to the magnetic target, wherein the magnetic target is fixedly attached to the pivotal member and does not move relative to the pivotal member, the pivotal member positioned so that movement of the pivotal member causes proportional translational movement of the magnetic target in the two dimensions of the plane; and a processor circuit configured to compute a translational location of the magnetic target within the two dimensions of the plane based on the proximity of the magnetic target to each of the magnetic field sensing elements.

17. The apparatus of claim 16 wherein the inputs are configured to receive the signals from Hall Effect elements, giant magnetoresistance elements, or both.

18. The apparatus of claim 17 wherein the apparatus further comprises a circuit for providing power to the magnetic field sensing elements.

19. The apparatus of claim 16 wherein the processor circuit is further configured to provide an X coordinate and a Y coordinate representing the translational location of the magnetic target.

20. The apparatus of claim 16 wherein the processor circuit is further configured to provide the translational location of magnetic target in a format compatible with a game or a simulation.

21. The apparatus of claim 16 wherein the apparatus is configured to be installed in a joystick.

* * * * *

UNITED STATES PATENT AND TRADEMARK OFFICE
CERTIFICATE OF CORRECTION

PATENT NO. : 9,625,535 B2
APPLICATION NO. : 13/960910
DATED : April 18, 2017
INVENTOR(S) : Bryan Cadugan et al.

Page 1 of 2

It is certified that error appears in the above-identified patent and that said Letters Patent is hereby corrected as shown below:

In the Specification

Column 2, Line 56, delete "or alternatively" and replace with --or, alternatively--

Column 4, Line 12, delete "analog to digital" and replace with --analog-to-digital--

Column 4, Line 21, delete "109 (represented by a dotted line in FIG. 1" and replace with --109 (represented by a dotted line in FIG. 1)--

Column 4, Line 31, delete "magnetic element 102" and replace with --magnetic target 102--

Column 4, Line 40, delete "system 100" and replace with --system 100a--

Column 5, Line 25, delete "anew 202" and replace with --arrow 202--

Column 5, Line 36, delete "close to and any" and replace with --close to any--

Column 5, Line 53, delete "102, 1904, 106" and replace with --102, 104, and 106--

Column 6, Line 23, delete "An any of these" and replace with --In any of these--

Column 6, Line 47-48, delete "106 and 108 senses" and replace with --106 and 108 sense--

Column 6, Line 49, delete "FIG. 5, graph 400" and replace with --FIG. 4, graph 400--

Column 6, Line 56, delete "elements 1104," and replace with --elements 104,--

Column 6, Line 63, delete "only, in" and replace with --only. In--

Column 7, Line 14, delete "to computer an" and replace with --to compute an--

Signed and Sealed this
Sixteenth Day of January, 2018

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,625,535 B2

Column 7, Line 16, delete "FIG. 6" and replace with --FIG. 5--

Column 7, Lines 19-20, delete "FIG. 6" and replace with --FIG. 5--

Column 7, Line 52, delete "sensors, since" and replace with --sensors. Since--

Column 7, Line 60, delete "compute an X and Y coordinates" and replace with --compute X and Y coordinates--

Column 9, Line 31, delete "FIG. 7" and replace with --FIG. 6--

Column 9, Line 54, delete "FIG. 8" and replace with --FIG. 7--